(12) United States Patent
Ketelsen et al.

(10) Patent No.: US 7,008,805 B2
(45) Date of Patent: Mar. 7, 2006

(54) OPTICAL DEVICE AND METHOD OF MANUFACTURE THEREOF

(75) Inventors: Leonard Jan-Peter Ketelsen, Clinton, NJ (US); Abdallah Ougazzaden, Fontenay Aux Roses (FR); Justin L. Peticolas, Wescosville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 10/729,090

(22) Filed: Dec. 5, 2003

(65) Prior Publication Data

US 2004/0121500 A1    Jun. 24, 2004

Related U.S. Application Data

(60) Provisional application No. 60/432,053, filed on Dec. 10, 2002.

(51) Int. Cl.
 *H01L 21/00* (2006.01)

(52) U.S. Cl. .................. 438/22; 257/432; 257/436; 257/451; 257/461; 372/46

(58) Field of Classification Search ................ 438/22; 257/432, 436, 451, 461; 372/46
See application file for complete search history.

(56) References Cited

U.S. PATENT DOCUMENTS

| 5,783,844 | A | | 7/1998 | Kobayashi et al. |
| 5,805,629 | A | * | 9/1998 | Takemi et al. ............... 372/46 |
| 6,277,663 | B1 | | 8/2001 | Matsumoto et al. |
| 6,664,605 | B1 | * | 12/2003 | Akulova et al. ............ 257/432 |

* cited by examiner

*Primary Examiner*—Mai-Huong Tran
(74) *Attorney, Agent, or Firm*—Hitt Gaines P.C.

(57) ABSTRACT

The present invention provides an optical device and a method of manufacture thereof. In one embodiment, the method of manufacturing the optical device may include isolating an end of a first layer from a cladding layer located over a mesa structure that has been formed from a substrate. The end of the first layer may be isolated from the cladding layer by encapsulating the end between second and third layers located adjacent the mesa structure.

18 Claims, 10 Drawing Sheets

OPTICAL DEVICE AND METHOD OF MANUFACTURE THEREOF

CROSS-REFERENCE TO RELATED APPLICATION

This Application claims the benefit of U.S. Provisional Application Ser. No. 60/432,053 filed on Dec. 10, 2002, entitled "OPTICAL DEVICE AND METHOD OF MANUFACTURE THEREOF," commonly assigned with the present invention and incorporated herein by reference.

The present invention is directed, in general, to a communication device and, more specifically, to an optical device having an encapsulated blocking layer and method of manufacture thereof.

BACKGROUND OF THE INVENTION

One common structure currently employed in optical devices is the p-i-n (PIN) device. In a typical PIN device, an intrinsic layer is disposed between a p-type layer and a n-type layer, forming a heterostructure device. The intrinsic layer has a larger index of refraction than the p and n layers, resulting in a natural waveguide. Furthermore, the energy band discontinuities in carrier confinement within the active layer. In short, the PIN device is well suited for a variety of emitting and detecting optical device applications.

Presently, it is common for PIN devices to be formed as buried PIN structures. In such devices, a mesa strip is formed out of the traditional PIN device, and thereafter, blocking layers are positioned on the sides of the mesa strip. Often, the blocking layers comprise PNIN structures. After the blocking layers have been formed, it is common for a p-type (zinc) doped cladding layer to be formed thereover, thus forming a capped-mesa buried heterostructure (CMBH).

A problem that arises in CMBH structures stems from the iron doped blocking layers being in contact with the zinc doped cladding layer. Specifically, the zinc and iron inter-diffuse when subjected to high temperatures. This inter-diffusion tends to increase the device's current leakage and parasitic capacitance, both of which are very undesirable.

One approach the optoelectronics industry has attempted to reduce this inter-diffusion was to form an undoped setback layer between the doped cladding layer and the blocking layers. While the undoped setback layer reduced, or substantially eliminated, the aforementioned inter-diffusion, it misplaced the position of the p-n junction.

Accordingly, what is needed in the art is an optical device, and a method of manufacture therefor, that does not experience the drawbacks experienced by the devices disclosed above. cl SUMMARY OF THE INVENTION To address the above-discussed deficiencies of the prior art, the present invention provides an optical device and a method of manufacture thereof. In one embodiment, the method of manufacturing the optical device includes isolating an end of a first layer from a cladding layer located over a mesa structure that has been formed from a substrate. The end of the first layer is isolated by encapsulating the end between second and third layers located adjacent the mesa structure.

The foregoing has outlined an embodiment of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the optics industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
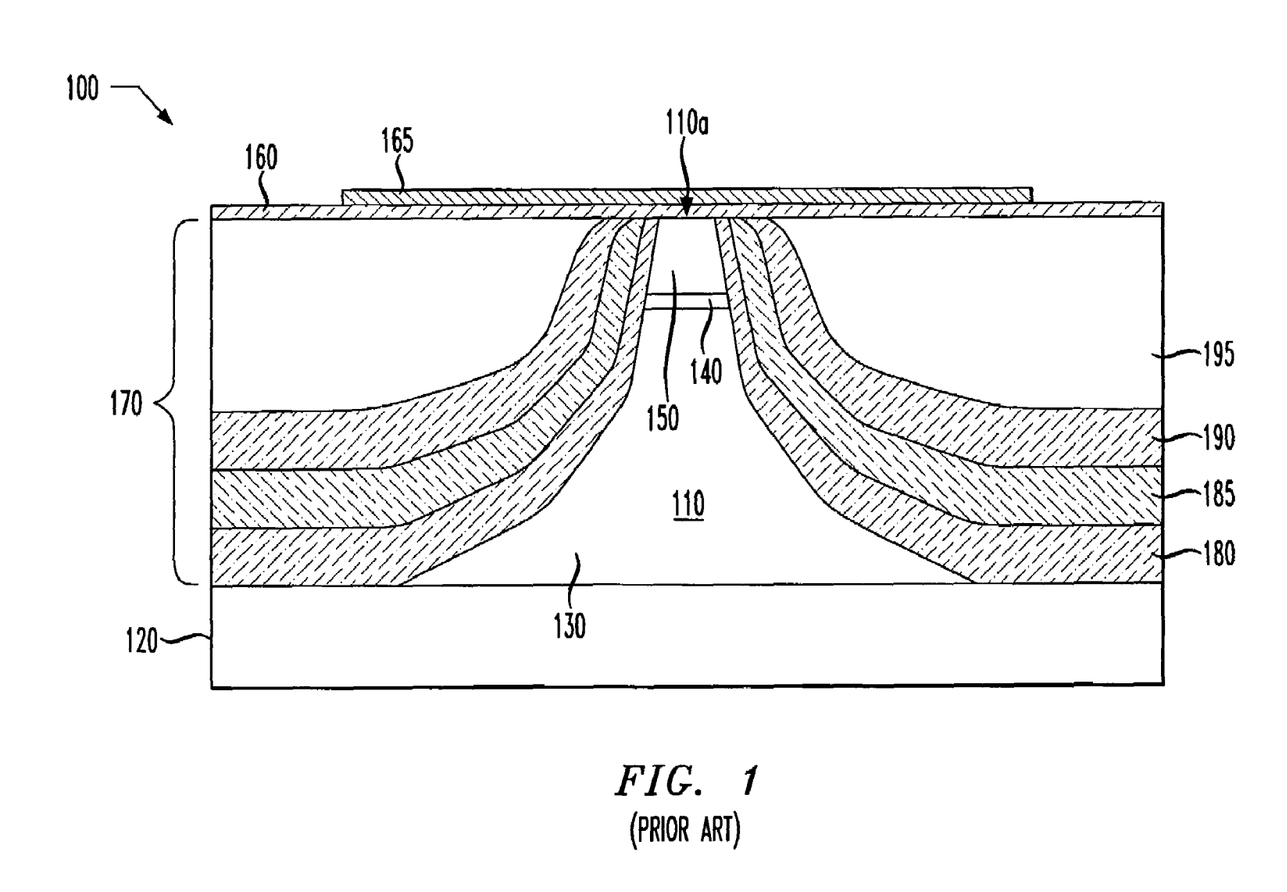
FIG. 1 illustrates a sectional view of an optical device constructed in accordance with the principles of the prior art.

Referring initially to FIG. 1, illustrated is a sectional view of an optical device 100 constructed in accordance with the principles of the prior art. The optical device 100 includes a mesa structure 110 formed over a substrate 120. The mesa structure 110 may comprise a variety of layers and materials and may be formed from the substrate 120 in some embodiments. In the embodiment shown, however, the mesa structure 110 includes a first mesa layer 130, a second mesa layer 140, and a third mesa layer 150. Typically, the first mesa layer 130 and the third mesa layer 150 are respective first and second cladding layers, and the second mesa layer 140 is an intrinsic layer, such as a conventional waveguide. A device cladding layer 160, conventionally comprising zinc-doped InP, and a contact 165 are shown formed over the mesa structure 110.

The optical device 100 also includes a plurality of blocking layers 170 formed over the substrate 120 and surrounding the mesa structure 110. The blocking layers 170 include a first layer 180 (e.g., p-type doped InAlAs or InP or other high-band gap materials like InGaP), a second layer 185 (e.g., n-type doped InP), a third layer 190 (e.g., iron-doped InP) and a fourth layer 195 (e.g., n-type doped InP). All of the blocking layers 170 extend upwards to an imaginary plane coincident with a top surface 110*a* of the mesa structure 110, ultimately terminating at and contacting the device cladding layer 160. The contact between the iron doped layer 190 and the zinc doped device cladding layer 160 permits the zinc and iron to inter-diffuse when subjected to high temperatures. As discussed above, this inter-diffusion tends to increase the optical device's current leakage and parasitic capacitance, both of which are very undesirable.

Figure 2:
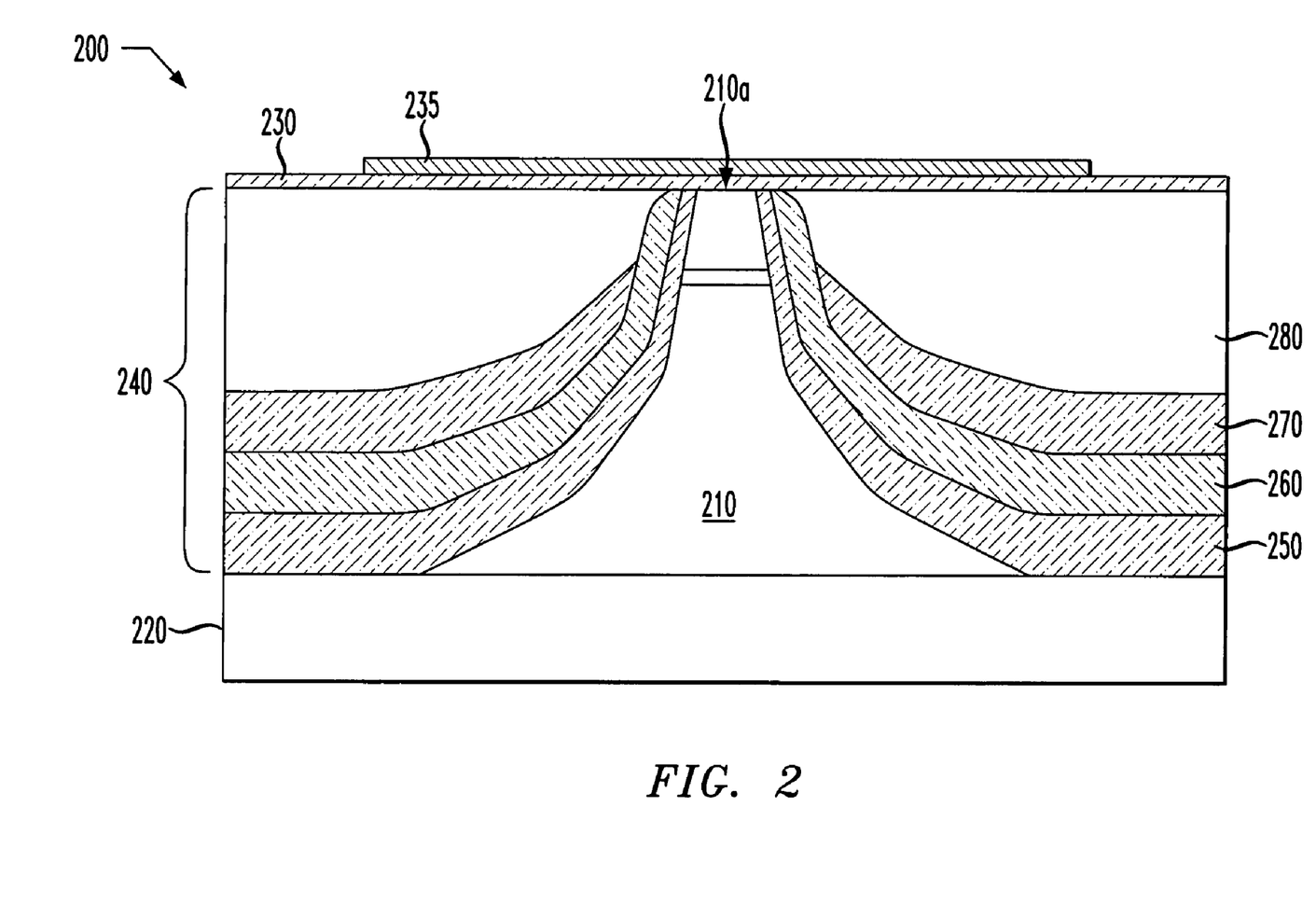
FIG. 2 illustrates a sectional view of one embodiment of an optical device constructed in accordance with the principles of the present invention.

Turning to FIG. 2, illustrated is a sectional view of one embodiment of an optical device 200 constructed according to the principles of the present invention. The present invention is broadly directed to an optical device 200 made of any material or compound that may have use in such devices. In the illustrative embodiments described herein, the optical device 200 is specifically discussed as a group III-V based device, for example an indium phosphide/indium gallium arsenide phosphide based device, a gallium arsenide based device, an aluminum gallium arsenide based device, or another group III-V based device. Even though the present invention is discussed in the context of a group III-V based device, it should be understood that the present invention is not limited to group III-V compounds and that other compounds located outside groups III-V may be used.

In addition to the optical device 200 being discussed as a group III-V based device, the optical device 200 is further discussed as a PIN diode. While the present invention is discussed in the context of a PIN diode, it should be noted that other devices, such as lasers, photodetectors, avalanch photodiode detectors (APDs), modulators, or other similar devices, may comprise the optical device 200. As an example, the present invention is particularly suited for any optical device that includes a mesa structure.

Turning back to the illustrative embodiment of FIG. 2, the optical device 200 includes a mesa structure 210 formed from or over a substrate 220. The mesa structure 210 may comprise a variety of layers and materials, as discussed above with reference to FIG. 1. A cladding layer 230, conventionally comprising zinc-doped InP, and a contact 235 are shown formed over the mesa structure 220.

The optical device 200 also includes a plurality of layers 240 formed over the substrate 220 and surrounding the mesa structure 210. In the embodiment shown, the plurality of layers 240 may comprise blocking layers. However, the present invention is not limited to devices employing blocking layers, such that the devices and methods described of the present invention may be advantageously employed in the formation of layers other than blocking layers.

The layers 240 include a layer 250 (e.g., p-type doped InAlAs), a layer 260 (e.g., n-type doped InP), a layer 270 (e.g., iron-doped InP) and a layer 280 (e.g., n-type doped InP). Most of the layers 240 extend to an imaginary plane coincident with a top surface 210*a* of the mesa structure 210, ultimately terminating at and contacting the cladding layer 230. However, it should be noted that the end of the layer 270 does not extend to or contact the cladding layer 230. In contrast, the end of the layer 270 is encapsulated by the layer 260 and the layer 280, and as such, it is isolated from the cladding layer 230. Because the layer 270 is isolated from the cladding layer 230, the zinc and iron molecules in the cladding layer 230 and the layer 270 may not inter-diffuse. Because such inter-diffusion is eliminated, the parasitic capacitance of the optical device 200 may be reduced. This, as one skilled in the art understands, also helps increase the operating speed of the optical device 200.

Figure 3:
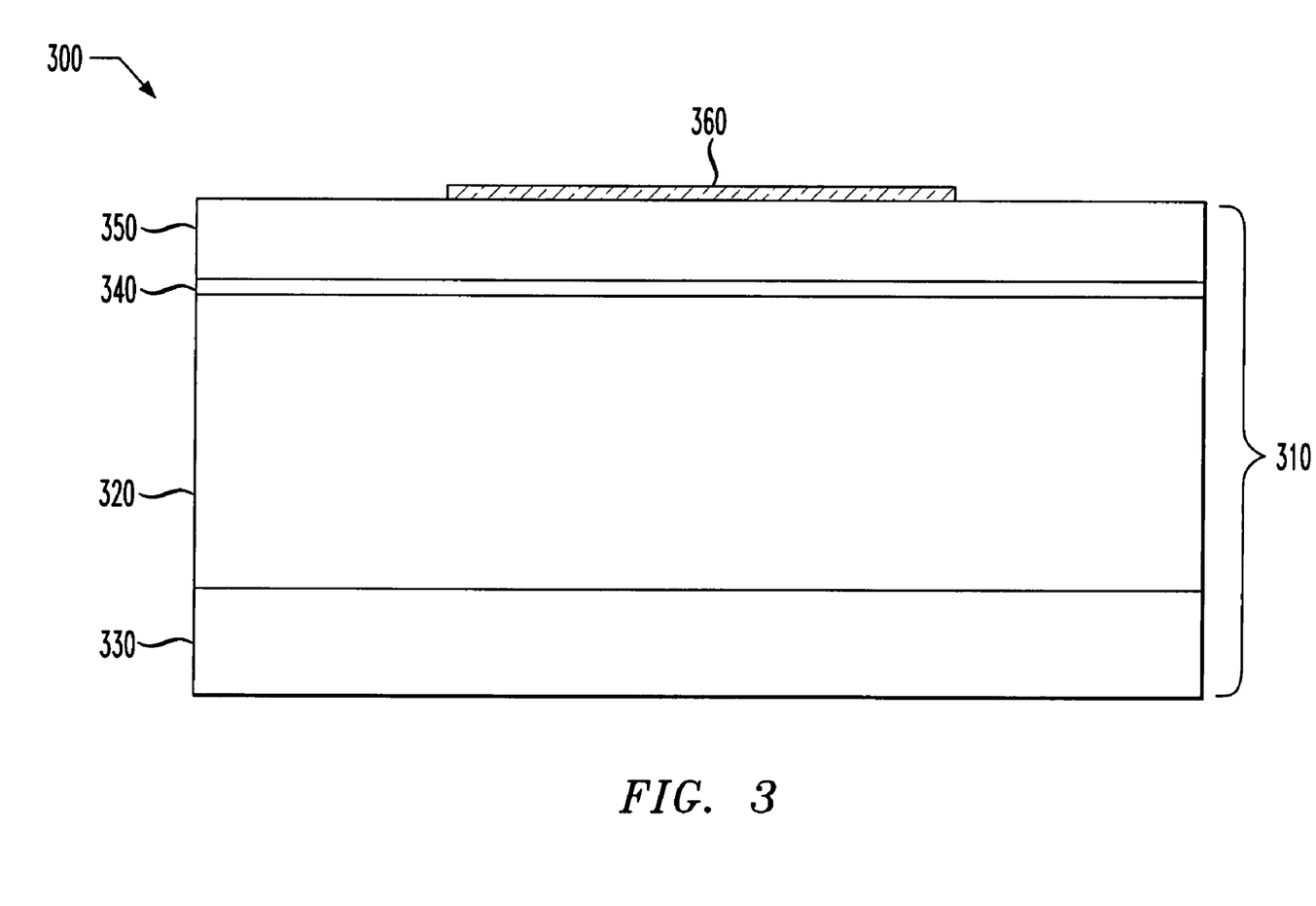
FIG. 3 illustrates a sectional view of one embodiment of a partially completed optical device constructed according to the principles of the present invention.

Turning to FIGS. 3–9, with continued reference to FIG. 2, illustrated are various intermediate stages of the manufacture of one embodiment of a device similar to the optical device 200 illustrated in FIG. 2. FIG. 3 illustrates a sectional view of one embodiment of a partially completed optical device 300, including a multilayered optical substrate 310. The multilayered optical substrate 310 includes a cladding layer 320, which in a previous step (not shown) was formed over a substrate 330. The substrate 330 may be any layer located in an optical device, including a layer located at the wafer level or a layer located above or below the wafer level. The substrate 330, in an exemplary embodiment, is an n+ type doped indium phosphide (InP) substrate, or in an alternative embodiment, a semi-insulating layer with an n+ doped InP layer located thereover.

In the illustrative embodiment, the cladding layer 320 is an n-type doped InP cladding layer. However, it should be understood that the cladding layer 320 is not limited to an ntype doped InP layer, and that other materials, doped or undoped, may be used.

An intrinsic layer 340 may be located over the substrate 330 and cladding layer 320. The intrinsic layer 340, as one skilled in the art readily recognizes, may be a quantum well region, and may include separate confining layers (not shown). In one exemplary embodiment, the intrinsic layer 340 includes materials chosen from group III-V compounds. The intrinsic layer 340 is typically intentionally not doped. However, in an alternative embodiment the intrinsic layer 340 may be doped as long as the p-n junction placement is taken into consideration.

The multilayered optical substrate 310 may also include a cladding layer 350 over the intrinsic layer 340. In the illustrative embodiment, the cladding layer 350 is an indium phosphide cladding layer having a dopant formed therein. The dopant is typically a p-type dopant, such as zinc. However, one having skill in the art understands that other dopants may be used, including cadmium, beryllium and magnesium.

The substrate 330, cladding layers 320 and 350, and intrinsic layer 340 may all be formed using conventional deposition processes. For example, a metal/organic vapor-phase epitaxy (MOVPE), molecular beam epitaxy (MBE), liquid phase epitaxy (LPE), or another similar epitaxial process may be used to form the various layers. In an exemplary embodiment, layers 320, 340 and 350 are all formed in the same process chamber. For example, in one advantageous embodiment, the partially completed optical device 300, including the substrate 330, may be placed within a MOCVD process chamber, wherein each of the remaining layers 320, 340 and 350 are formed.

Also shown in the illustrative embodiment of FIG. 3 is a mask region 360 formed over the cladding layer 350. The mask region 360 may comprise a number of various materials while staying within the scope of the present invention. The mask region 360 may be formed using conventional deposition and photolithographic masking techniques.

Figure 4:
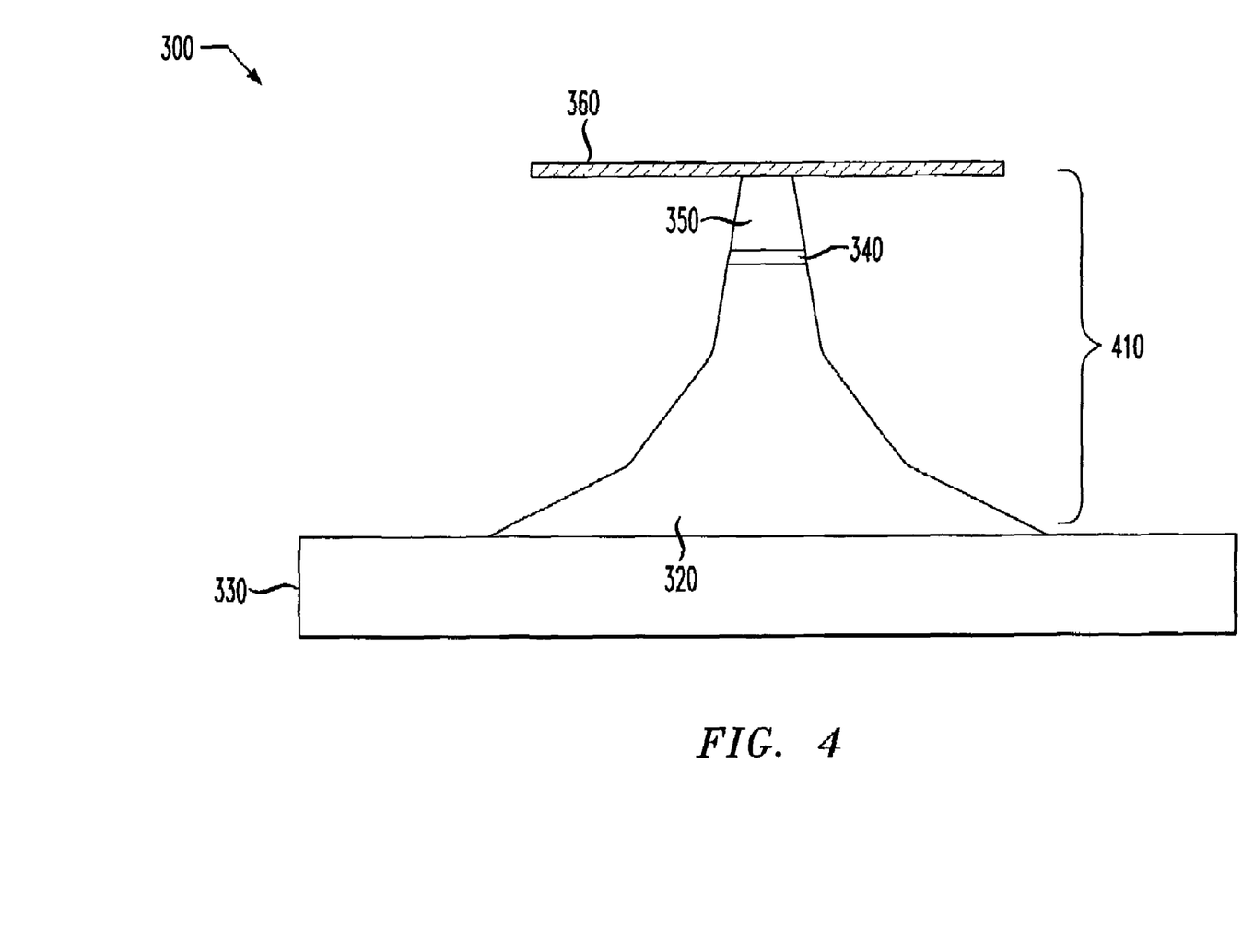
FIG. 4 illustrates the partially completed optical device illustrated in FIG. 3 after the formation of a mesa structure.

Turning to FIG. 4, illustrated is the partially completed optical device 300 illustrated in FIG. 3, after the formation of a mesa structure 410 that may be similar to the mesa structure 210 shown in FIG. 2. Generally, the mesa structure 410 may be formed using a conventional wet etch. For example, the etching may be carried out by using a conventional Br-methanol solution or a solution comprising a mixture of oxygenated water and hydrochloric acid. However, other etchant materials are within the purview of the present invention. As can be observed in FIG. 4, the conventional wet etch may have both a vertical component and a horizontal component. For example, it is common for the ratio of vertical etch to horizontal etch to be about 1 to 1.

Figure 5:
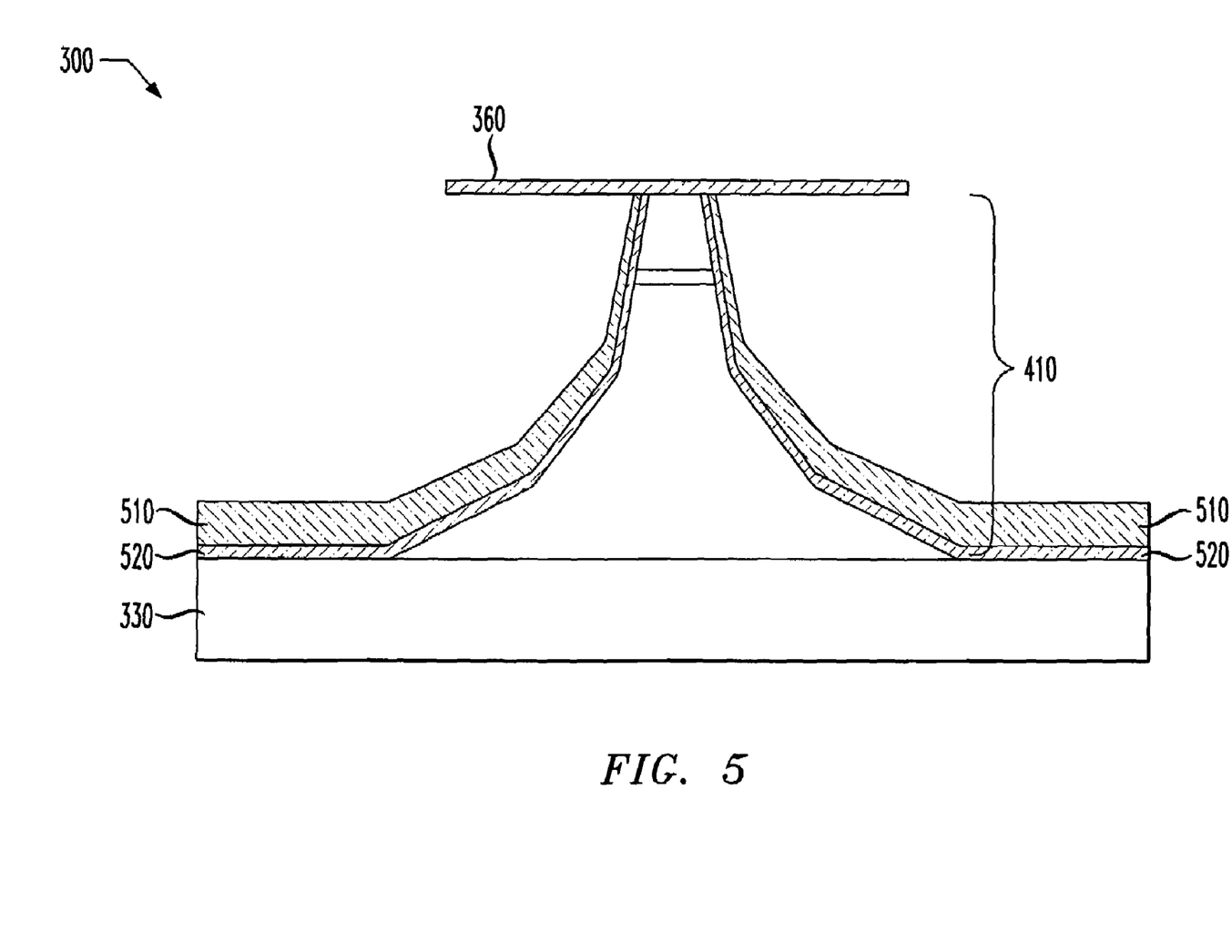
FIG. 5 illustrates the partially completed optical device illustrated in FIG. 4 after the formation of a first layer.

Turning to FIG. 5, illustrated is the partially completed optical device 300 illustrated in FIG. 4 after the formation of a layer 510 over the substrate 330 and alongside the mesa structure 410. The layer 510 may be conventionally formed, as discussed below. In one embodiment, the layer 510 may comprise InP having a p-type dopant, such as zinc, formed therein. The layer 510 may substantially or completely cover the surfaces of the substrate 330 and the mesa structure 410 that were exposed during the previous etching to form the mesa structure 410. In an advantageous embodiment, the layer 510 is deposited in an environment that is substantially free of phosphorous trichloride ($PCl_3$), and thus extends to and terminates at the mask region 360.

In one advantageous embodiment, as shown in FIG. 5, an additional layer 520 may be conventionally formed on the exposed surfaces of the substrate 330 and the mesa structure 410 prior to the formation of the layer 510. The layer 520 may comprise indium aluminum arsenide, and may be formed by a process similar to that used to form the layer 510.

Figure 6:
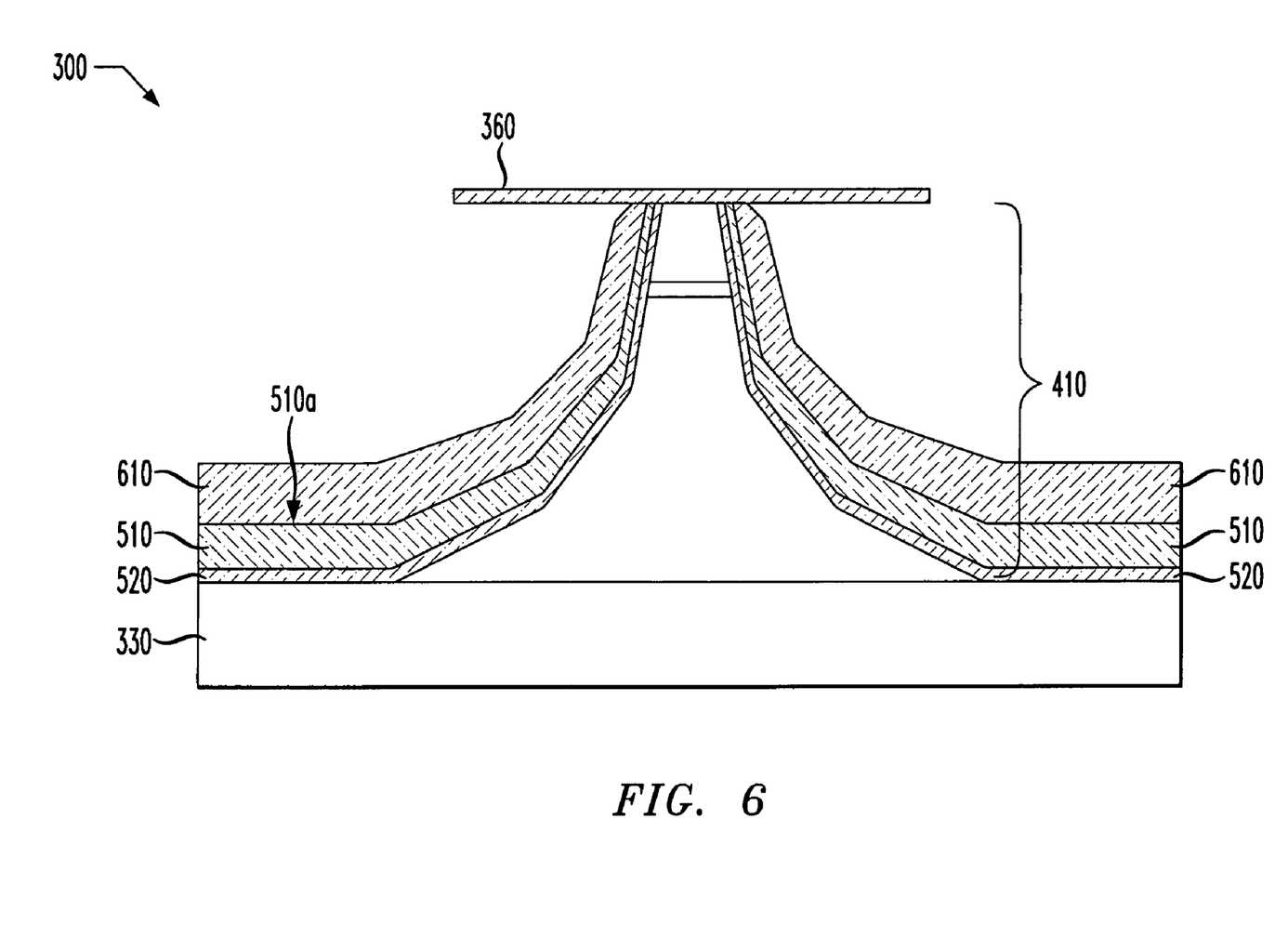
FIG. 6 illustrates the partially completed optical device illustrated in FIG. 5 after the formation of another layer.

Turning to FIG. 6, illustrated is the partially completed optical device 300 illustrated in FIG. 5 after the formation of a layer 610 over the layer 510. The layer 610 may be conventionally formed, as discussed below. In one embodiment, the layer 610 may comprise InP having an n-type dopant, such as silicon, formed therein. The layer 610 may substantially or completely cover an upper or outer surface 510a of the layer 510 previously formed. In an advantageous embodiment, the layer 610 is also formed in an environment that is substantially free of phosphorous trichloride ($PCl_3$), and thus extends to and terminates at the mask region 360.

As discussed above, the layers 51 and 610 may be formed using conventional deposition processes. For example, a metal organic vapor-phase epitaxy (MOVPE), molecular beam epitaxy (MBE), liquid phase epitaxy (LPE), or another similar epitaxial process may be used. In one advantageous embodiment, the MOVPE process may be conducted at a temperature ranging from about 530 EC to about 660 EC, and a growth chamber pressure ranging from about 50 mbar to about atmospheric pressure. It should be noted, however, that these process parameters may vary without departing from the scope of the present invention.

In an advantageous embodiment, the layers 510 and 610 are formed in an environment substantially or completely free of phosphorous trichloride ($PCl_3$) or any other material, such as carbon tetracholoride (CCl4) or other compounds containing chlorine (Cl) or bromine (Br), that might prevent substantially uniform growth of the layers 510 and 610 along all crystallographic planes. By growing the layers 510 and 610 in this manner, they may provide substantially uniform coverage over the underlying structure.

Figure 7:
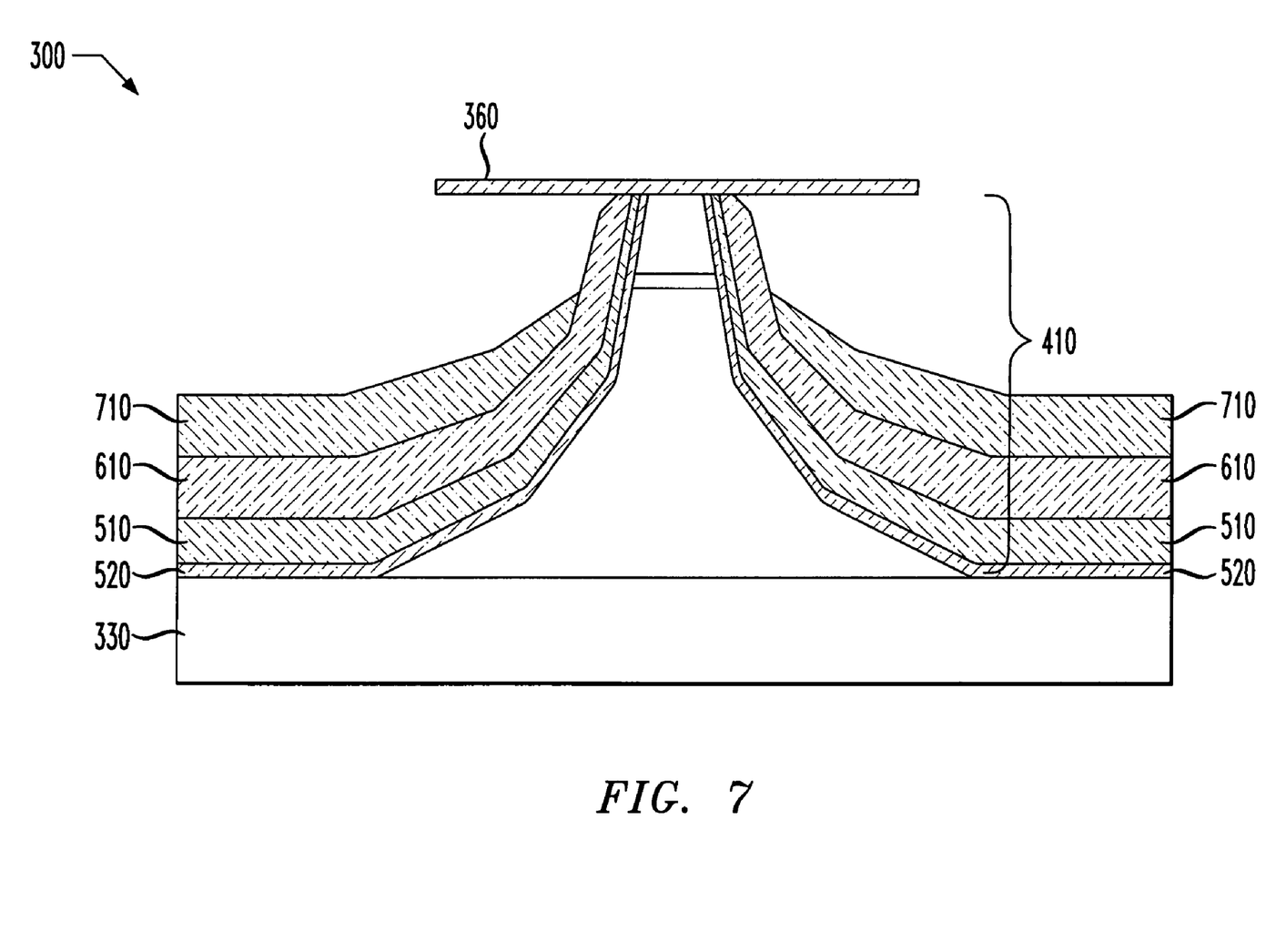
FIG. 7 illustrates the partially completed optical device illustrated in FIG. 6 after the formation of an isolated layer.

Turning to FIG. 7, illustrated is the partially completed optical device 300 illustrated in FIG. 5 after the formation of a layer 710 over the layer 610. The layer 710 may comprise InP doped with iron or another metal capable of diffusing into a compound containing a metal doped Group III-V element. While the layers 510 and 610 may be conventionally formed, the layer 710 is formed in the presence of phosphorous trichloride ($PCl_3$) or another compound containing chlorine or bromine. It has been unexpectedly found that growing the layer 710 in this manner causes the layer 710 to grow in certain specific crystallographic planes, such as the <3,1,1>, <4,1,1> or <1,0,0> planes. The layer 710 may be grown in an environment wherein $PCl_3$ has been introduced by MOVPE, MBE, LPE or another similar epitaxial process. As shown in the illustrative embodiment, forming the layer 710 by growing the layer 710 in selective crystallographic planes prevents the layer 710 from extending to and contacting the mask region 360.

In one advantageous embodiment, the layer 710 may be grown at a temperature ranging from about 530 EC to about 660 EC, and a growth chamber pressure ranging from about 50 mbar to about atmospheric pressure. The flow rates of the $PCl_3$ ranges from about 0.1 sccm to about 0.5 sccm, and in an advantageous embodiment, the $PCl_3$ flow rate is about 0.5 sccm, while the flow rate of the trimethyl- or triethyl-indium and phosphine is about 2 sccm and 100 sccm, respectively. It should be noted, however, that these process parameters may vary without departing from the scope of the present invention.

Figure 8:
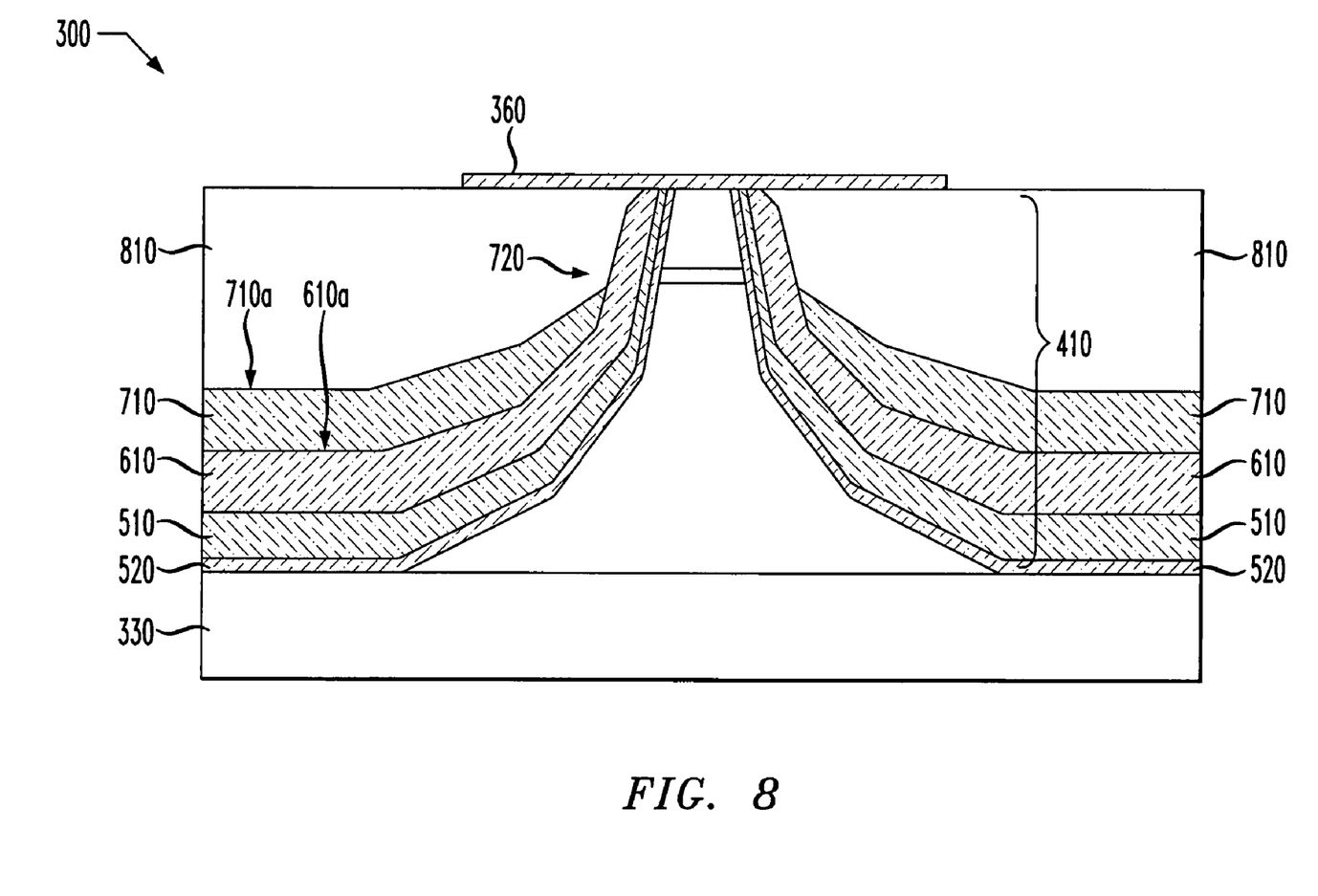
FIG. 8 illustrates the partially completed optical device illustrated in FIG. 7 after the formation of yet another layer.

Turning to FIG. 8, illustrated is the partially completed optical device 300 illustrated in FIG. 7 after the formation of a layer 810 over or alongside portions of the layers 610 and 710. The layer 810 may be conventionally formed, in a manner similar to the formation of the layers 510 and 610, as discussed above. In one embodiment, the layer 810 may comprise InP having an n-type dopant, such as silicon, formed therein. In one advantageous embodiment, the layer 810 extends to and terminates at the mask region 360. The layer 810 may substantially or completely cover an upper or outer surface 710a of the layer 710 and an upper or outer surface 610a of the layer 610. The combination of the layer 810 and the layer 610 encapsulates an end 720 of the layer 710, as shown in the illustrated embodiment. The encapsulation of the end 720 of the layer 710 between the adjacent layers 610 and 810 isolates the layer 710 from the mask region 360.

Figure 9:
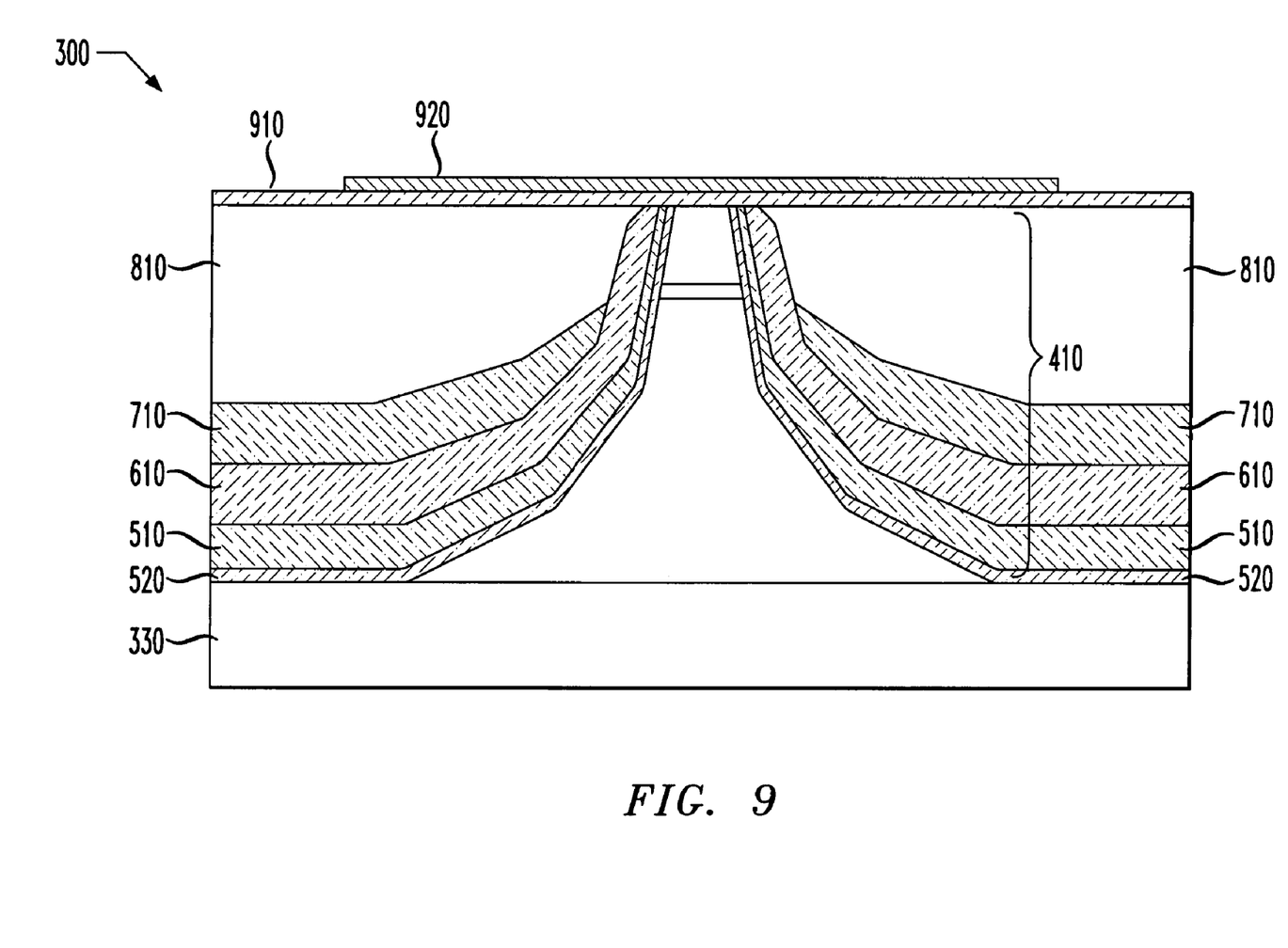
FIG. 9 illustrates the partially completed optical device illustrated in FIG. 8 after the formation of a cladding layer and a contact.

Turning to FIG. 9, illustrated is the partially completed optical device 300 illustrated in FIG. 8 after the removal of the mask region 360 by conventional processes, as well as the conventional formation of a cladding layer 910 and contact 920. In one advantageous embodiment, the cladding layer 910 may comprise a compound containing a metal doped Group III-V element, such as zinc-doped InP. However, the zinc-doped cladding layer 910 will not inter-diffuse with the iron doped layer 710, because the layer 710 is isolated from the cladding layer 910 by encapsulation between the adjacent layers 610 and 810.

In an exemplary embodiment, the layers 510, 610, 710 and 810 may be formed in the same process chamber. For example, the partially completed optical device 300 may be placed within a MOCVD process chamber wherein each of the remaining layers 510, 610, 710 and 810 are formed. Of course, each of the layers 510, 610, 710 and 810 may be formed under different process parameters and comprise different materials and still be formed in the same process chamber.

As previously recited, a benefit of the present method of manufacturing the optical device 300, and the resulting optical device 300, is the ability to substantially eliminate the surface area upon which the iron-doped layer 710 contacts the upper zinc-doped cladding layer 910, thereby preventing the inter-diffusion of the dopants between such layers. Because such inter-diffusion is inhibited, if not substantially eliminated, the parasitic capacitance of the optical device 300 is reduced. This, as one skilled in the art understands, also helps increase the operating speed of the optical device 300.

Figure 10:
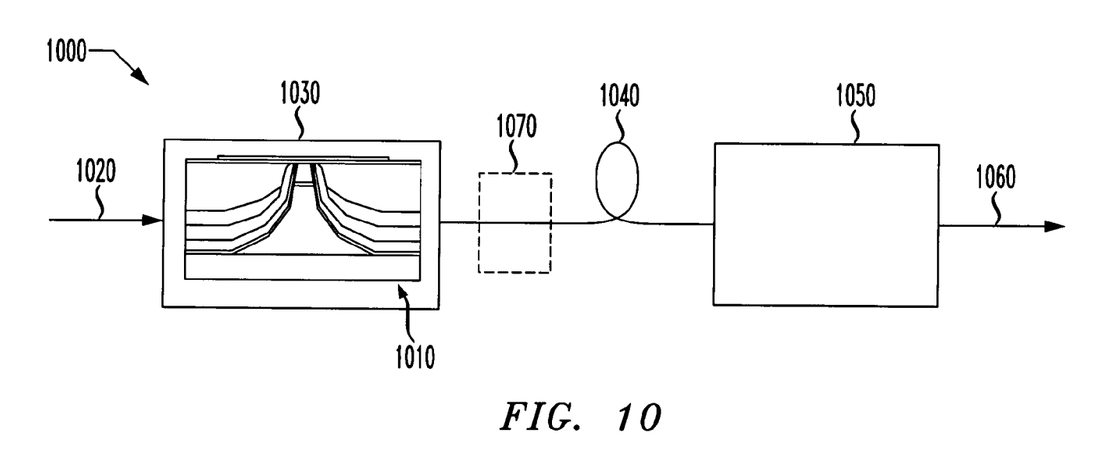
FIG. 10 illustrates an optical communication system, which may form one environment where an optical device similar to the completed optical device illustrated in FIG. 1 may be included.

Turning briefly to FIG. 10, illustrated is an optical communication system 1000, which may form one environment where an optical device 1010 similar to the completed optical device 200 illustrated in FIG. 2 may be included. In the illustrative embodiment, the optical communication system 1000 includes an initial signal 1020 entering a transmitter 1030, which may be an optical transmitter 1030. In such instances, the mesa structure discussed above may be an optical laser that provides a radiation or light source for the transmitter. The transmitter 1030 accepts the initial signal 1020 and sends the resulting information across an optical fiber 1040 to a receiver 1050. The receiver 1050 receives the information from the optical fiber 1040 and provides an ultimate signal 1060. The optical communication system 1000 is not limited to the devices previously mentioned and may further include one or more additional components 1070, which may include PIN diodes, lasers, modulators and/or photodetectors.

Figure 11:
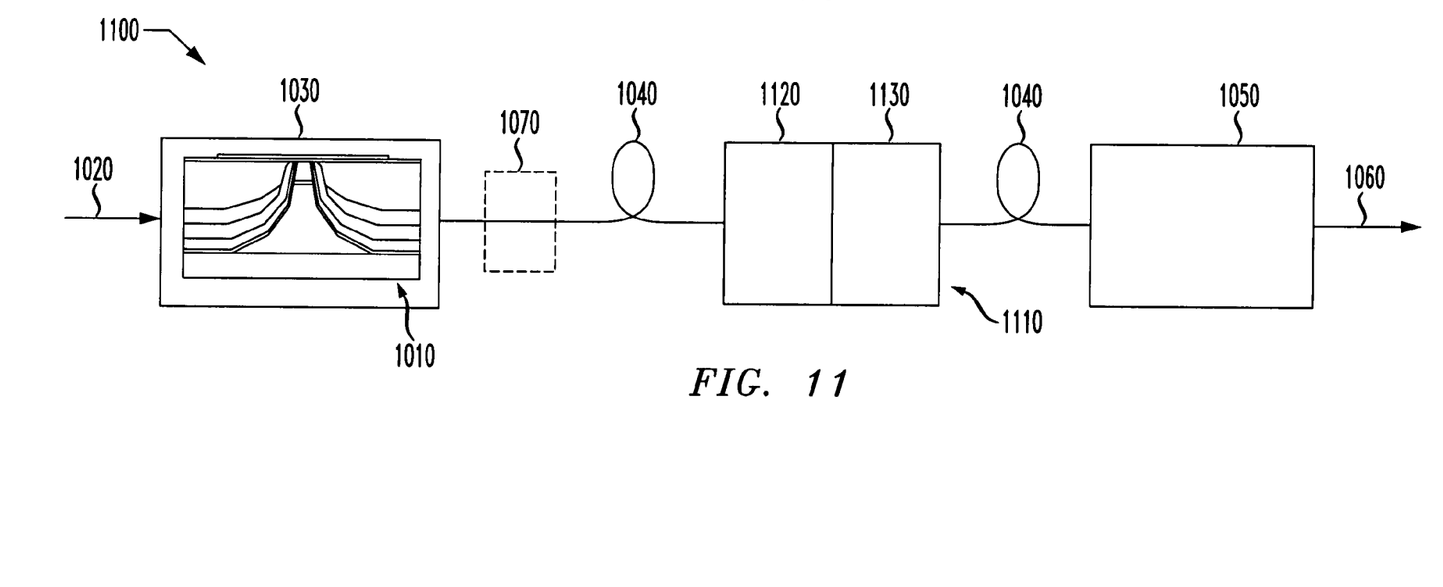
FIG. 11 illustrates an alternative optical communication system incorporating the device provided by the present invention.

Turning briefly to FIG. 11, illustrated is an alternative optical communication system 1100 which may be similar to the optical communication system 1000 illustrated in FIG. 10 except as discussed below. The optical communication system 1100 may include a repeater 1110, including a second receiver 1120 and a second transmitter 1130, located between the transmitter 1030 and the receiver 1050.

Although the present invention has been described in detail, those skilled in the art should understand that they can make various changes, substitutions and alterations herein without departing from the spirit and scope of the invention in its broadest form.

What is claimed is:

1. A method of manufacturing an optical device, comprising:
    forming a mesa structure from said substrate, said mesa structure having a cladding layer located thereover; and
    isolating an end of a first layer from said cladding layer by encapsulating said end between second and third layers located adjacent said mesa structure, wherein said first layer comprises indium phosphide and said encapsulating includes forming said first layer having said isolated end in the presence phosphorous trichloride.

2. The method as recited in claim 1 wherein said second and third layers comprise indium phosphide and said encapsulating includes forming said second and third layers in an atmosphere substantially free of phosphorous trichloride.

3. The method as recited in claim 1 wherein said isolating includes forming said first layer in the presence of a compound containing chlorine or bromine.

4. The method as recited in claim 1 wherein said second and third layers are doped with an n-type dopant.

5. The method as recited in claim 1 further including a fourth layer wherein said second layer is located between said first and fourth layers and said fourth layer is doped with a p-type dopant.

6. The method as recited in claim 1 wherein said first layer is doped with a metal capable of diffusing into said cladding layer.

7. A method of manufacturing an optical device, comprising:
    forming a mesa structure from said substrate, said mesa structure having a cladding layer located thereover; and
    isolating an end of a first layer from said cladding layer by encapsulating said end between second and third layers located adjacent said mesa structure, wherein said second and third layers comprise indium phosphide and said encapsulating includes forming said second and third layers in an atmosphere substantially free of phosphorous trichioride.

8. The method as recited in claim 7 wherein said first layer comprises indium phosphide and said encapsulating includes forming said first layer having said isolated end in the presence phosphorous trichloride.

9. The method as recited in claim 7 wherein said isolating includes forming said first layer in the presence of a compound containing chlorine or bromine.

10. The method as recited in claim 7 wherein said second and third layers are doped with an n-type dopant.

11. The method as recited in claim 7 further including a fourth layer wherein said second layer is located between said first and fourth layers and said fourth layer is doped with a p-type dopant.

12. The method as recited in claim 7 wherein said first layer is doped with a metal capable of diffusing into said cladding layer.

13. A method of manufacturing an optical device, comprising:
    forming a mesa structure from said substrate, said mesa structure having a cladding layer located thereover; and
    isolating an end of a first layer from said cladding layer by encapsulating said end between second and third layers located adjacent said mesa structure, wherein said isolating includes forming said first layer in the presence of a compound containing chlorine or bromine.

14. The method as recited in claim 13 wherein said first layer comprises indium phosphide and said encapsulating includes forming said first layer having said isolated end in the presence phosphorous trichloride.

15. The method as recited in claim 13 wherein said second and third layers comprise indium phosphide and said encapsulating includes forming said second and third layers in an atmosphere substantially free of phosphorous trichloride.

16. The method as recited in claim 13 wherein said second and third layers are doped with an n-type dopant.

17. The method as recited in claim 13 further including a fourth layer wherein said second layer is located between said first and fourth layers and said fourth layer is doped with a p-type dopant.

18. The method as recited in claim 13 wherein said first layer is doped with a metal capable of diffusing into said cladding layer.

* * * * *